United States Patent
Chen et al.

(10) Patent No.: US 10,354,978 B1
(45) Date of Patent: Jul. 16, 2019

(54) STACKED PACKAGE INCLUDING EXTERIOR CONDUCTIVE ELEMENT AND A MANUFACTURING METHOD OF THE SAME

(71) Applicant: Powertech Technology Inc., Hukou Township, Hsinchu County (TW)

(72) Inventors: Ming-Chih Chen, Hukou Township, Hsinchu County (TW); Hung-Hsin Hsu, Hukou Township, Hsinchu County (TW); Yuan-Fu Lan, Hukou Township, Hsinchu County (TW); Chi-An Wang, Hukou Township, Hsinchu County (TW); Hsien-Wen Hsu, Hukou Township, Hsinchu County (TW)

(73) Assignee: POWERTECH TECHNOLOGY INC., Hukou Township, Hsinchu County (TW)

(*) Notice: Subject to any disclaimer, the term of this patent is extended or adjusted under 35 U.S.C. 154(b) by 0 days.

(21) Appl. No.: 15/867,577

(22) Filed: Jan. 10, 2018

(51) Int. Cl.
*H01L 25/065* (2006.01)
*H01L 23/48* (2006.01)
(Continued)

(52) U.S. Cl.
CPC ........ *H01L 25/0657* (2013.01); *H01L 21/561* (2013.01); *H01L 21/568* (2013.01);
(Continued)

(58) Field of Classification Search
CPC . H01L 25/0657; H01L 21/561; H01L 21/568; H01L 21/76898; H01L 21/78; H01L 23/481; H01L 24/02; H01L 24/05; H01L 24/13; H01L 24/96; H01L 25/50; H01L 2224/02372; H01L 2224/0401; H01L 2224/05024; H01L 2224/13026; H01L 2224/95001; H01L 2225/06513;
(Continued)

(56) References Cited

U.S. PATENT DOCUMENTS

| | | | |
|---|---|---|---|
| 5,571,754 A * | 11/1996 | Bertin | H01L 25/0657 257/E25.013 |
| 9,490,195 B1 * | 11/2016 | Prabhu | H01L 23/49575 |

(Continued)

FOREIGN PATENT DOCUMENTS

| | | |
|---|---|---|
| TW | 201027692 A1 | 7/2010 |
| TW | 201801265 A | 1/2018 |
| TW | 201801279 A | 1/2018 |

*Primary Examiner* — Didarul A Mazumder
(74) *Attorney, Agent, or Firm* — patenttm.us

(57) ABSTRACT

A stacked package has plurality of chip packages stacked on active surfaces of each other, a dielectric layer, a redistribution layer and a plurality of external terminals. Each chip package has an exterior conductive element formed on the active surface. Each exterior conductive element has a cut edge exposed on at least one of the lateral side of the chip package. The dielectric layer, the redistribution layer and the external terminals are formed in sequence on the lateral side with the exposed cut edges to form the electrical connection between the cut edges, the redistribution layer and the external terminals. Therefore, the process for forming the electrical connections is simplified to enhance the reliability and the UPH for manufacturing the stacked package.

9 Claims, 20 Drawing Sheets

(51) Int. Cl.
| | |
|---|---|
| *H01L 23/00* | (2006.01) |
| *H01L 21/56* | (2006.01) |
| *H01L 21/768* | (2006.01) |
| *H01L 21/78* | (2006.01) |
| *H01L 25/00* | (2006.01) |

(52) U.S. Cl.
CPC ........ *H01L 21/76898* (2013.01); *H01L 21/78* (2013.01); *H01L 23/481* (2013.01); *H01L 24/02* (2013.01); *H01L 24/05* (2013.01); *H01L 24/13* (2013.01); *H01L 24/96* (2013.01); *H01L 25/50* (2013.01); *H01L 2224/02372* (2013.01); *H01L 2224/0401* (2013.01); *H01L 2224/05024* (2013.01); *H01L 2224/13026* (2013.01); *H01L 2224/95001* (2013.01); *H01L 2225/06513* (2013.01); *H01L 2225/06544* (2013.01); *H01L 2225/06555* (2013.01); *H01L 2225/06582* (2013.01)

(58) Field of Classification Search
CPC . H01L 2225/06544; H01L 2225/06555; H01L 2225/06582
USPC .......................................................... 257/621
See application file for complete search history.

(56) References Cited

U.S. PATENT DOCUMENTS

| | | | |
|---|---|---|---|
| 2008/0308921 A1* | 12/2008 | Kim | ...................... H01L 21/561 |
| | | | 257/686 |
| 2012/0020026 A1* | 1/2012 | Oganesian | .......... H01L 23/5389 |
| | | | 361/707 |
| 2015/0357298 A1* | 12/2015 | Jang | ........................ H01L 25/50 |
| | | | 257/773 |
| 2016/0379967 A1 | 12/2016 | Gamini | |
| 2017/0110413 A1* | 4/2017 | Chen | .................... H01L 21/3205 |
| 2017/0186711 A1* | 6/2017 | Fang | ........................ H01L 24/02 |
| 2018/0145060 A1* | 5/2018 | Appelt | ................ H01L 25/0652 |

* cited by examiner

STACKED PACKAGE INCLUDING EXTERIOR CONDUCTIVE ELEMENT AND A MANUFACTURING METHOD OF THE SAME

BACKGROUND OF THE INVENTION

1. Field of the Invention

The present invention relates to a semiconductor package, and in particular to a stacked package and a manufacturing method of the same.

2. Description of the Prior Arts

Stacking a plurality of chips has been implemented in various semiconductor packages to achieve miniaturization of component integration. The wire bonding method and the through silicon via (TSV) with micro bump are conventional ways to provide electrical interconnection between the stacked chips and the external terminals. However, the conventional ways have following disadvantages.

When the chips are connected to the external terminals by wire bonding, the intervals between the bonding wires need to be preserved to avoid contacts between the adjacent bonding wires. The intervals inevitably increase the size of the conventional stacked package. Thus, the conventional stacked package with bonding wires does not easily achieve miniaturization. In addition, the wire bonding process takes a lot of time since all of the wires for one conventional stacked package cannot be bonded simultaneously. Therefore, the unit per hour (UPH) of the conventional stacked package manufactured by the wire bonding process is relatively low.

When the chips are connected to each other by the TSV and the micro bumps, the TSV increases stacked heights and processing complexity leading to larger package thickness and lower manufacturing yield. In addition, the requirements for the precision of alignment and locating among the micro bumps are very high. When the dimension of the conventional stacked packages become larger and larger, the position shift of the micro bumps becomes greater and greater leading to poor packaging yield.

To overcome the shortcomings, the present invention provides a stacked package and a manufacturing method of the same to mitigate or to obviate the aforementioned problems.

SUMMARY OF THE INVENTION

The main objective of the present invention is to provide a stacked package and a manufacturing method of the same that has higher UPH and better reliability. The stacked package has plurality of chip packages stacked on active surfaces of each other, a dielectric layer, a redistribution layer and a plurality of external terminals. Each chip package has an exterior conductive element formed on the active surface. Each exterior conductive element has a cut edge exposed on at least one of the lateral side of the chip package. The dielectric layer, the redistribution layer and the external terminals are formed in sequence on the lateral side with the exposed cut edges to form the electrical connection between the cut edges, the redistribution layer and the external terminals. Therefore, the process for forming the electrical connections is simplified to enhance the reliability and the UPH for manufacturing the stacked package.

Other objectives, advantages and novel features of the invention will become more apparent from the following detailed description when taken in conjunction with the accompanying drawings.

DETAILED DESCRIPTION OF THE EMBODIMENTS

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 15A:
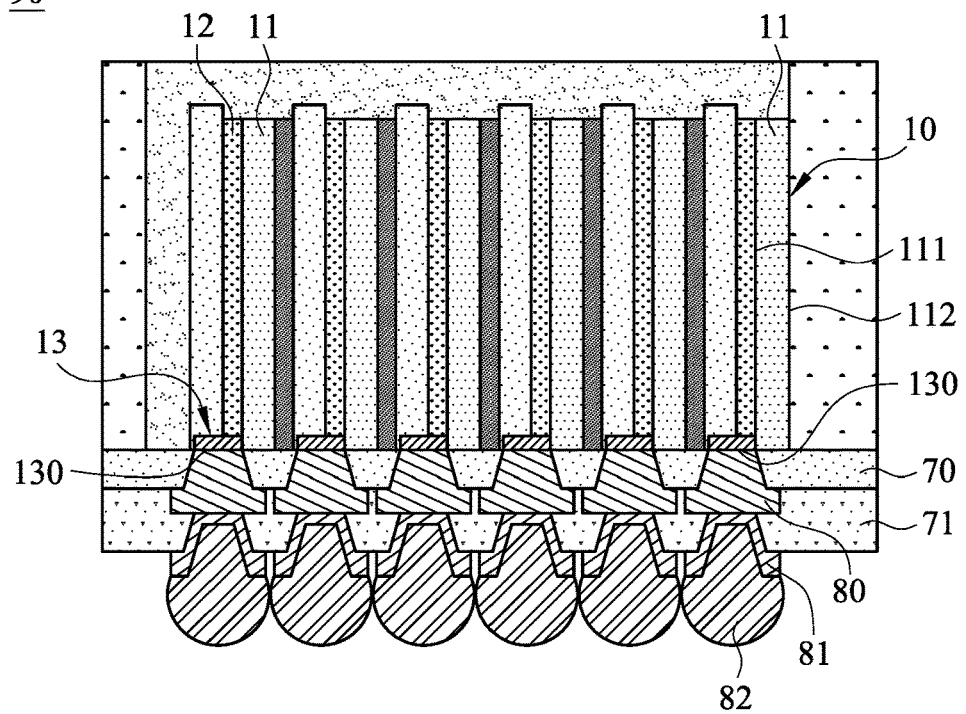
FIG. 15A is a front view in partial section of a first embodiment of a stacked package in accordance with the present invention.

With reference to FIG. 15A, a stacked package 90 in accordance with the present invention comprises a plurality of chip packages 10. The chip package 10 has at least two lateral sides, a chip 11, a passivation layer 12 and a plurality of exterior conductive elements 13. The chip 11 has an active surface 111 and a back surface 112. The back surface 112 is opposite to the active surface 111. The passivation layer 12 is formed on the active surface 111. The exterior conductive elements 13 are formed on the active surface 111 of the chip 11, and each exterior conductive element 13 has a cut edge 130 exposed on at least one of the lateral sides of the chip package 10. The chip package 10 may include, but is not limited to, following structures.

Figure 1A:
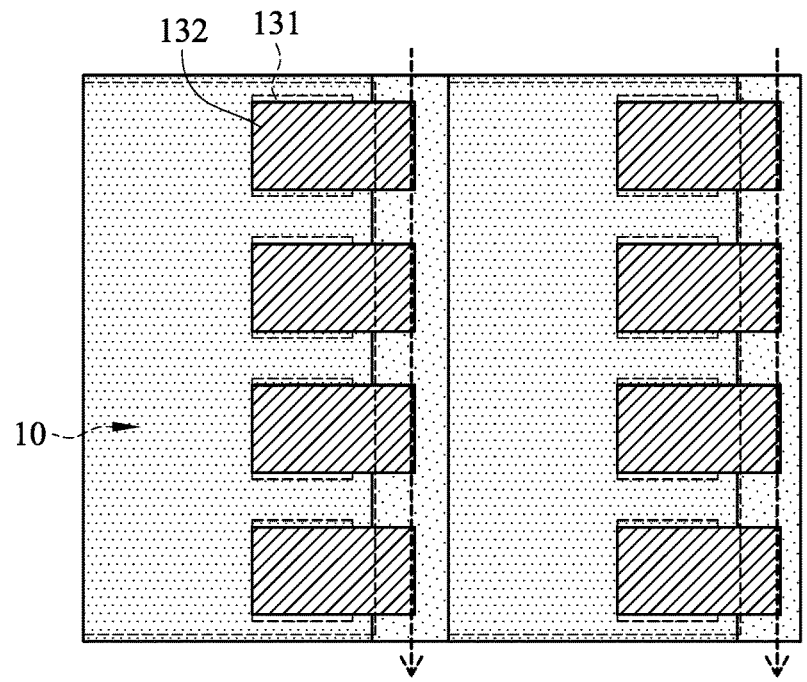
FIG. 1A is a top view in partial section of a first embodiment of a chip package of a stacked package in accordance with the present invention.
Figure 1B:
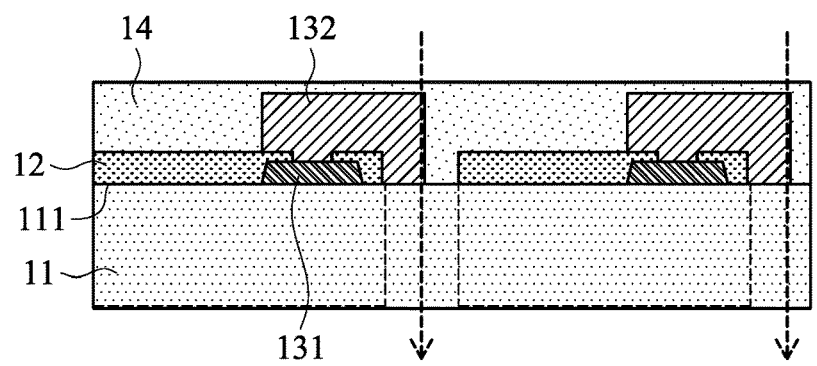
FIG. 1B is a front view in partial section of the chip package in FIG. 1A.
Figure 1C:
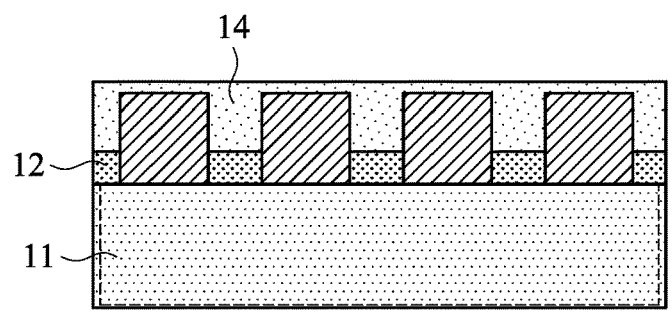
FIG. 1C is a side view in partial section of the chip package in FIG. 1A.

In one embodiment as shown in FIGS. 1A to 1C, the chip package 10 includes a plurality of bond pads 131, a plurality of exterior traces 132, and a chip-dielectric layer 14. Each bond pad 131 is formed on the active surface 111 and is encapsulated by the passivation layer 12. Each exterior trace 132 is formed on a corresponding bond pad 131, extends out of the passivation layer 12, and has an end exposed on one of the lateral sides. The chip-dielectric layer 14 is formed on the passivation layer 12 and the exterior traces 132. The chip-dielectric layer 14 may be a polyimide layer.

Figure 2A:
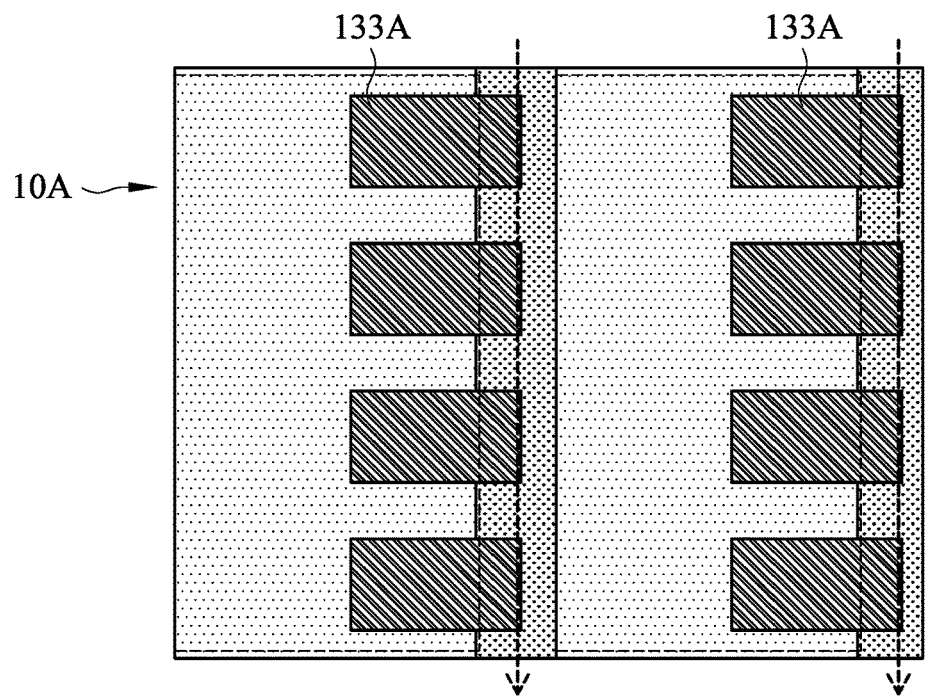
FIG. 2A is a top view in partial section of a second embodiment of a chip package of a stacked package in accordance with the present invention.
Figure 2B:
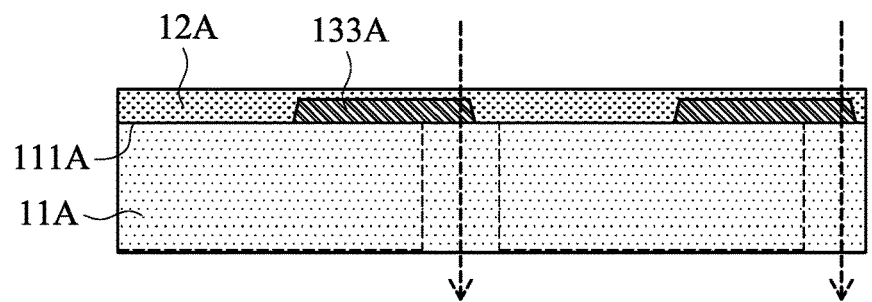
FIG. 2B is a front view in partial section of the chip package in FIG. 2A.
Figure 2C:
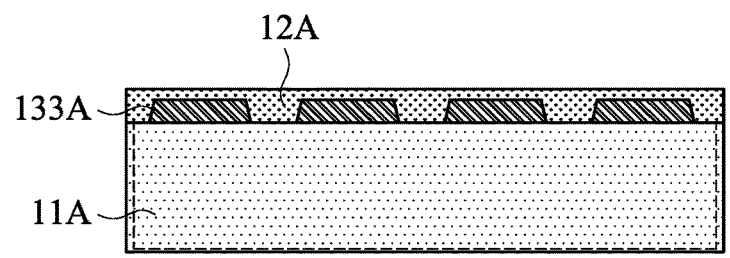
FIG. 2C is a side view in partial section of the chip package in FIG. 2A.

In one embodiment as shown in FIGS. 2A to 2C, the chip package 10A includes a plurality of conductive pad 133A. Each conductive pad 133A is formed on the active surface 111A of the chip 11A, is encapsulated by the passivation layer 12A, and has an end exposed on one of the lateral sides of the chip package 10A.

Figure 3A:
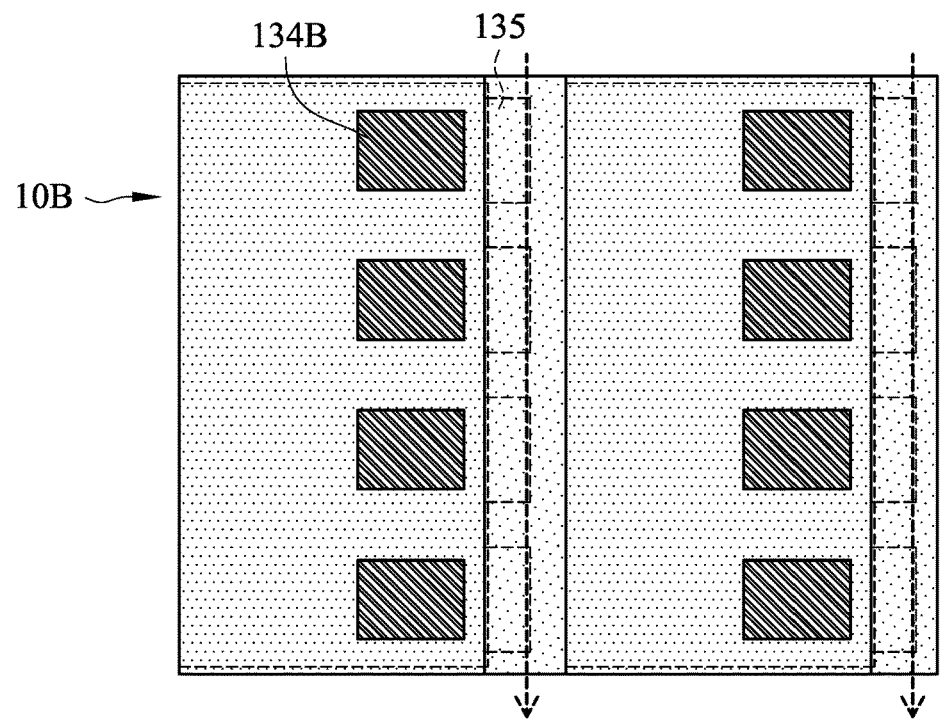
FIG. 3A is a top view in partial section of a third embodiment of a chip package of a stacked package in accordance with the present invention.
Figure 3B:
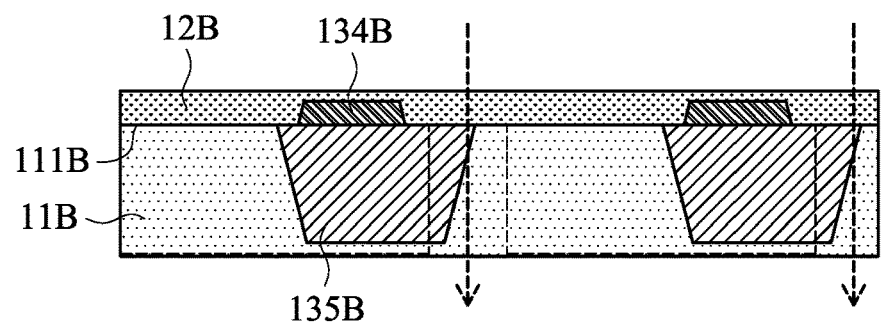
FIG. 3B is a front view in partial section of the chip package in FIG. 3A.
Figure 3C:
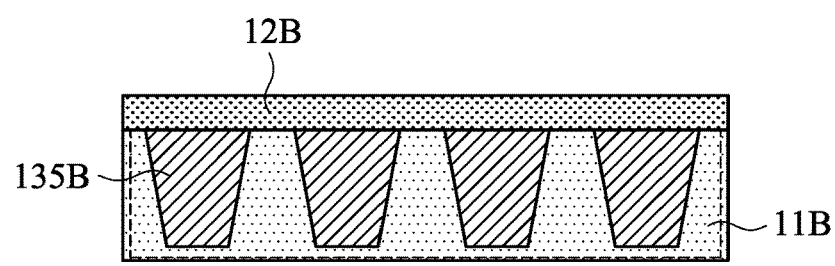
FIG. 3C is a side view in partial section of the chip package in FIG. 3A.

In one embodiment as shown in FIGS. 3A to 3C, the chip package 10B includes a plurality of bond pads 134B and a plurality of through silicon vias (TSVs) 135B. Each bond pad 134B is formed on the active surface 111B of the chip 11B and is encapsulated by the passivation layer 12B. Each TSV 135B is formed in the chip 11B, is coupled to a corresponding bond pad 134B, and has an end exposed on one of the lateral sides.

In summary, the cut edge 130 of each exterior conductive element 13 may be the exterior trace 132 as shown in FIGS. 1A to 1B, may be the conductive pad 133A as shown in FIGS. 2A to 2C, or may be the TSV 135B as shown in FIGS. 3A to 3C.

Figure 4:
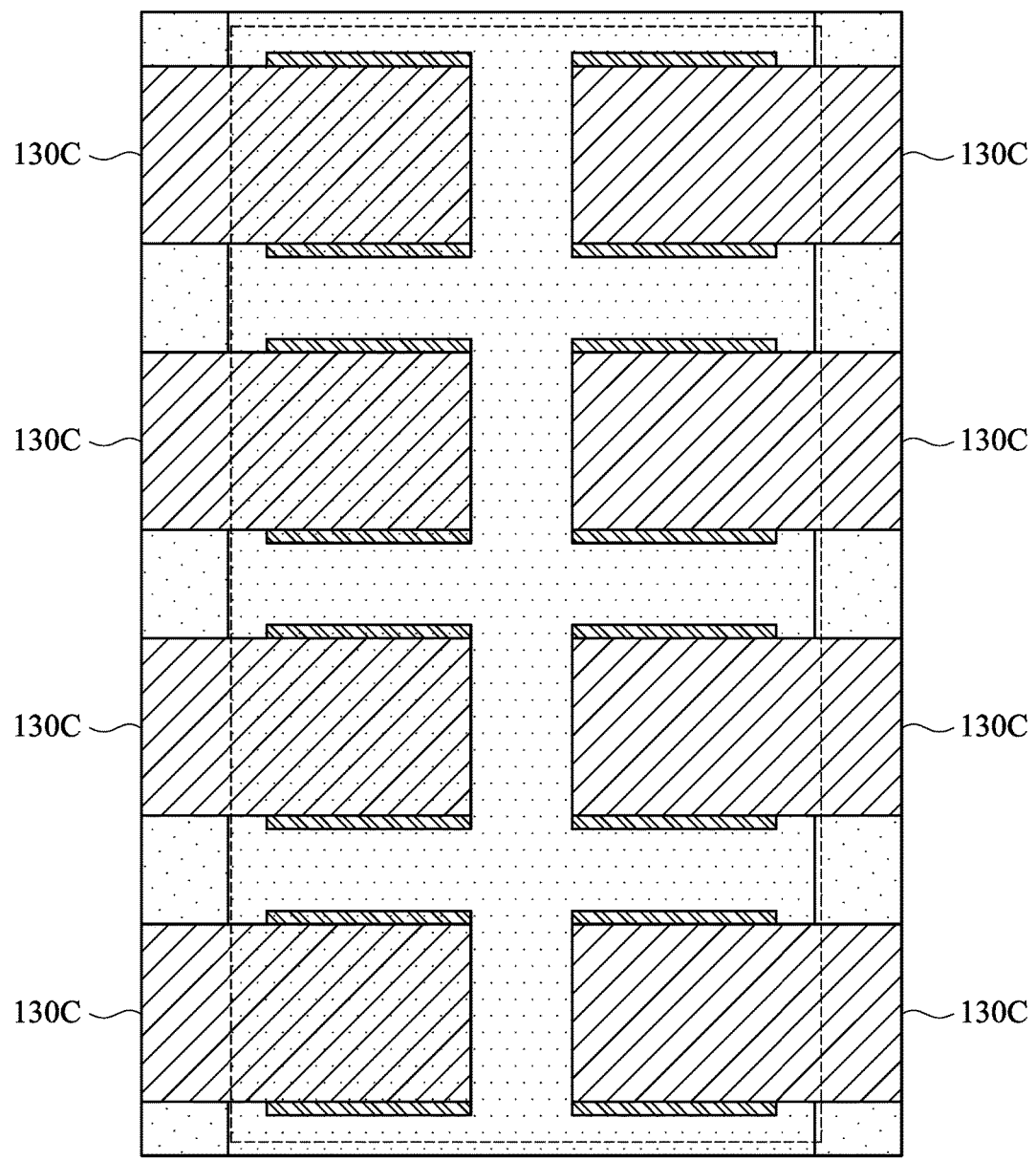
FIG. 4 is a top view in partial section of a fourth embodiment of a chip package of a stacked package in accordance with the present invention.

An exemplary embodiment shown in FIG. 4 has the cut edges 130C of the exterior conductive elements correspondingly exposed on two lateral sides of the chip package 10C.

Figure 5A:
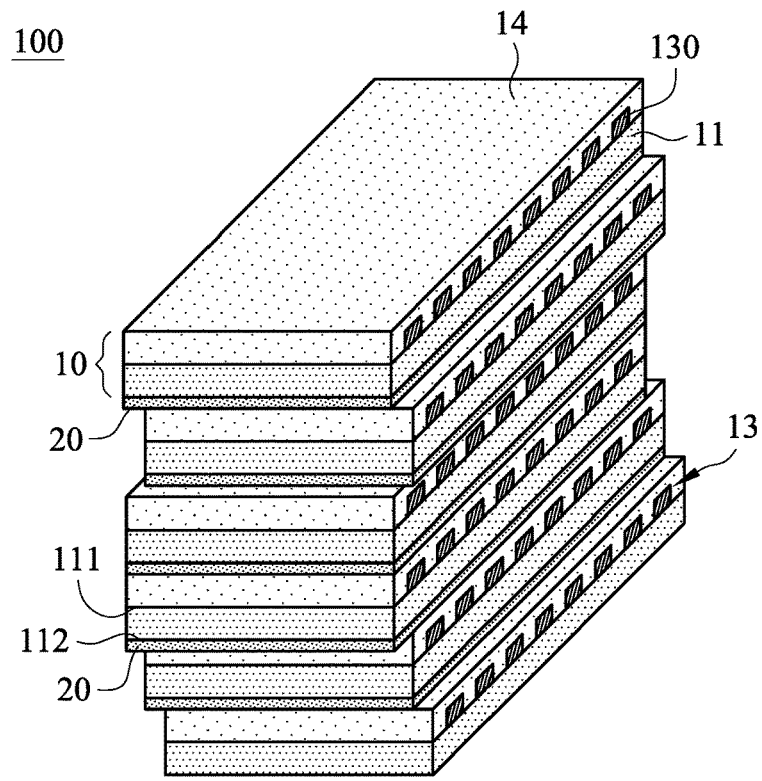
FIGS. 5A, 6, 7, 8A, 9A, 10A, 11A, 12A, 13A and 14A are perspective views of a structure of a stacked package during a first embodiment of a manufacturing process in accordance with the present invention.
Figure 5B:
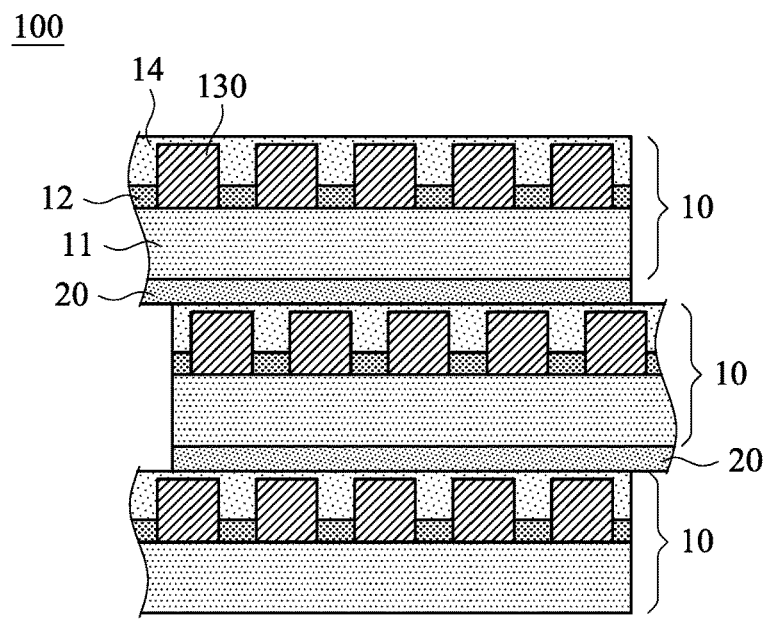
FIGS. 5B, 8B, 9B, 10B, 11B, 12B, 13B and 14B are front views in partial section of a stacked package during the first embodiment of the manufacturing process in accordance with the present invention.

A manufacturing method of a stacked package in accordance with the present invention are illustrated from FIGS. 5A to 14B and comprises following steps:

With reference to FIGS. 5A and 5B, a chip stack 100 is formed by stacking a plurality of chip packages 10 on top of each other. The plurality of chip packages 10 are adhered to each other by using a plurality of adhesives 20 correspondingly disposed between adjacent chip packages 10. The adhesives 20 are attached to the back surfaces 112 of the chips 11. The adhesives 20 may be die attach films (DAF), epoxies, insulation pastes, or the like. The chip packages 10 may align with each other through a precise alignment process or may have misalignment when alignment process is not implemented.

Figure 6:
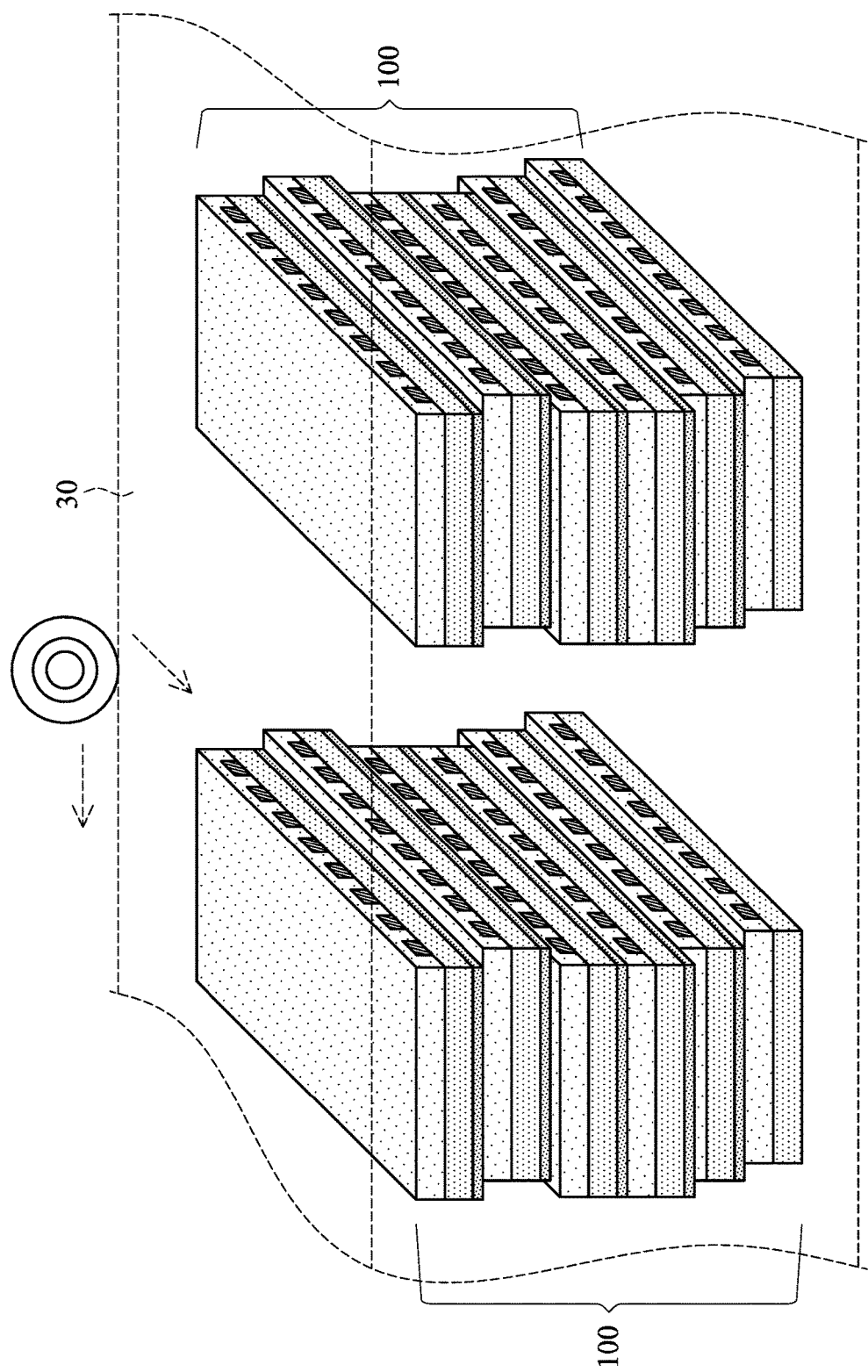
Figure 7:
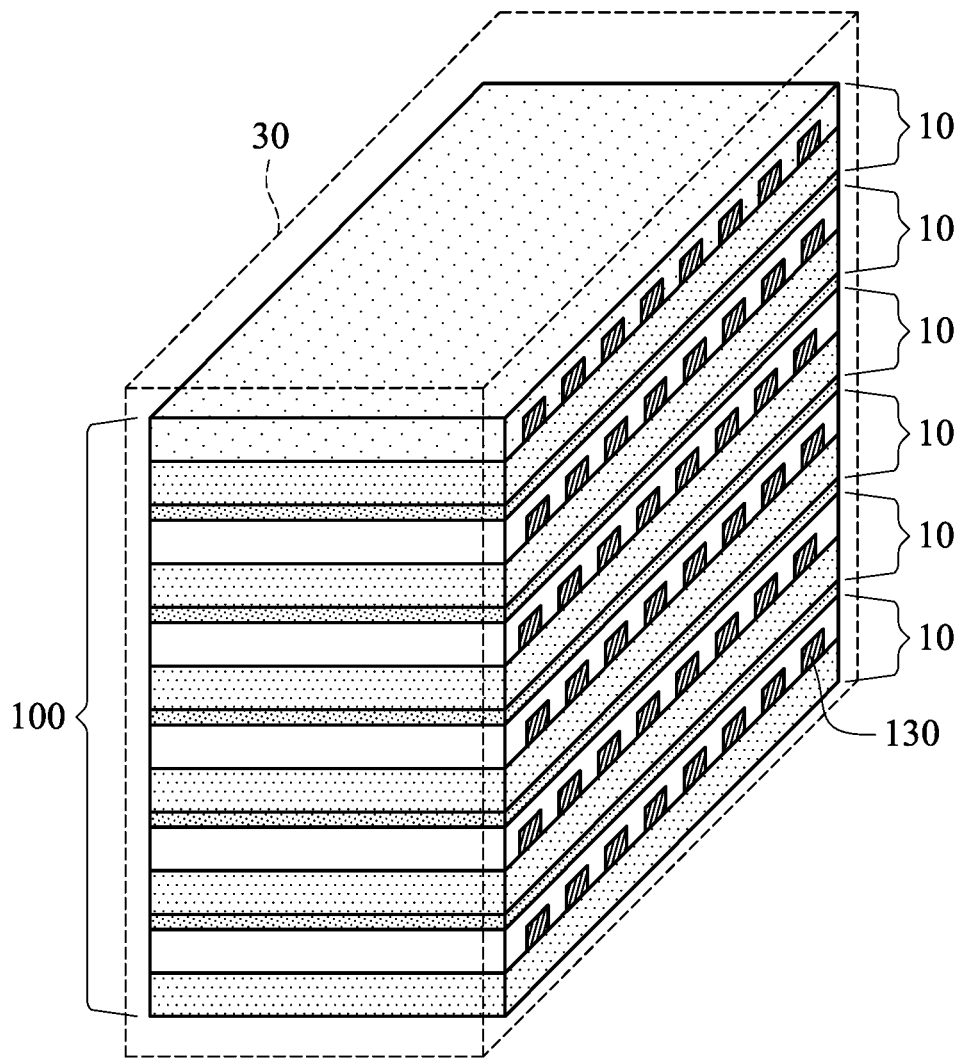

With reference to FIG. 6, a plurality of chip stacks 100 are encapsulated by a first encapsulant 30. The first encapsulant 30 may provide packaging protection to the chip stacks 100 to avoid electrical short and contamination. With reference to FIGS. 6 and 7, the chip stacks 100 are diced to form a plurality of chip encapsulations 40. In one embodiment, the chip packages 10 are diced to align with each other when the chip packages 10 may misalign with each other after forming the chip stacks 100. In one embodiment, after the chip packages 10 are diced, the at least one lateral side of the chip packages 10 having the cut edges 130 exposed may be align with each other.

Figure 8A:
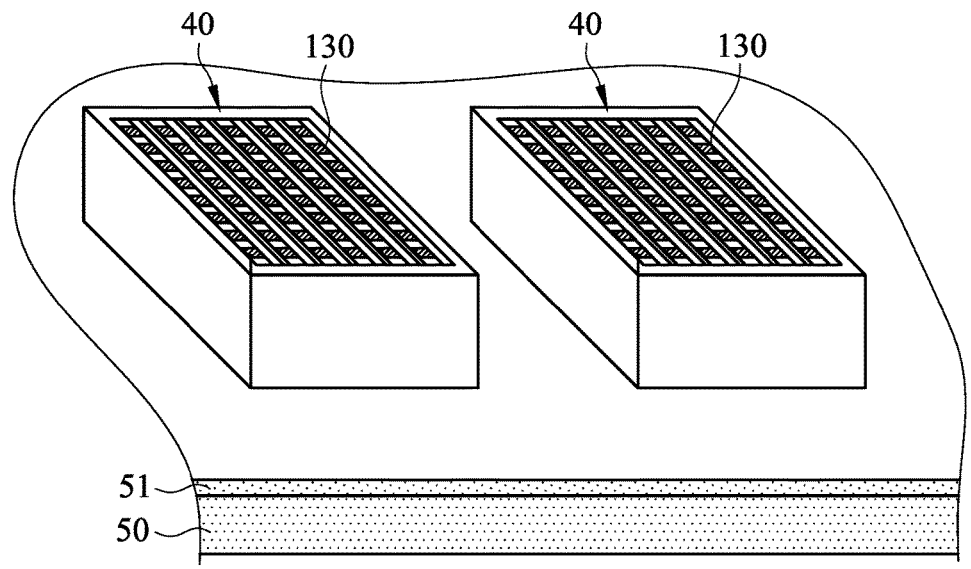
Figure 8B:
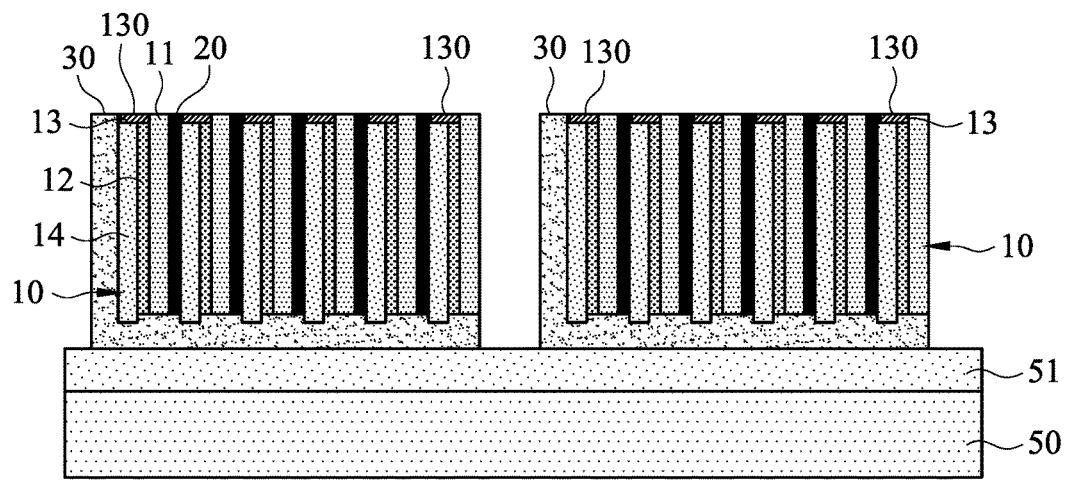

With reference to FIGS. 8A and 8B, the chip encapsulations 40 are arranged on a carrier 50. The chip encapsulations 40 can be attached on the carrier 50 through an adhesive film 51 disposed between the chip encapsulations 40 and the carrier 50. One of the lateral sides of each chip package 10 faces the carrier 50, and the cut edges 130 of the exterior conductive elements 13 face away from the carrier 50. In one embodiment, the chip encapsulations 40 are arranged in an array on the carrier 50. In one embodiment, the carrier 50 may be a glass carrier or a semiconductor carrier in wafer type or in panel type.

Figure 9A:
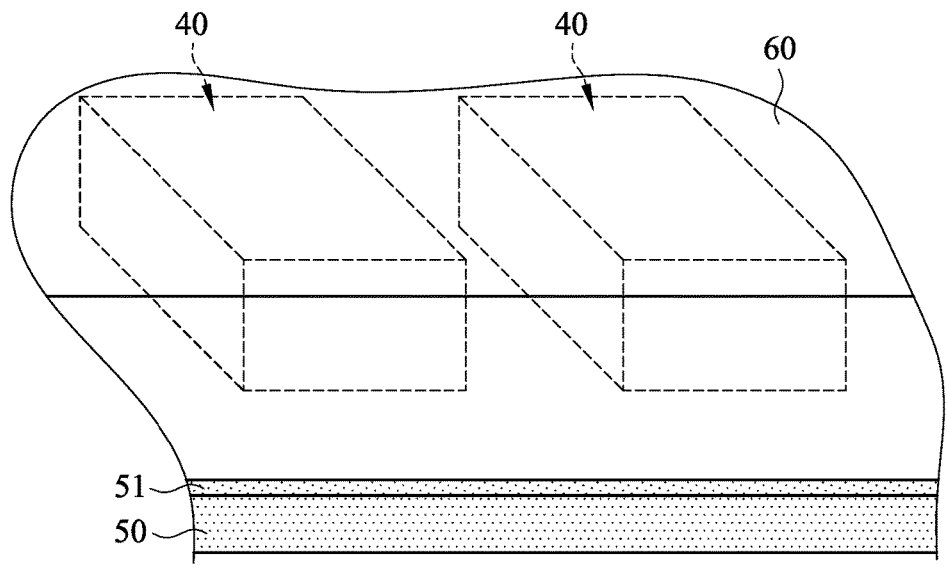
Figure 9B:
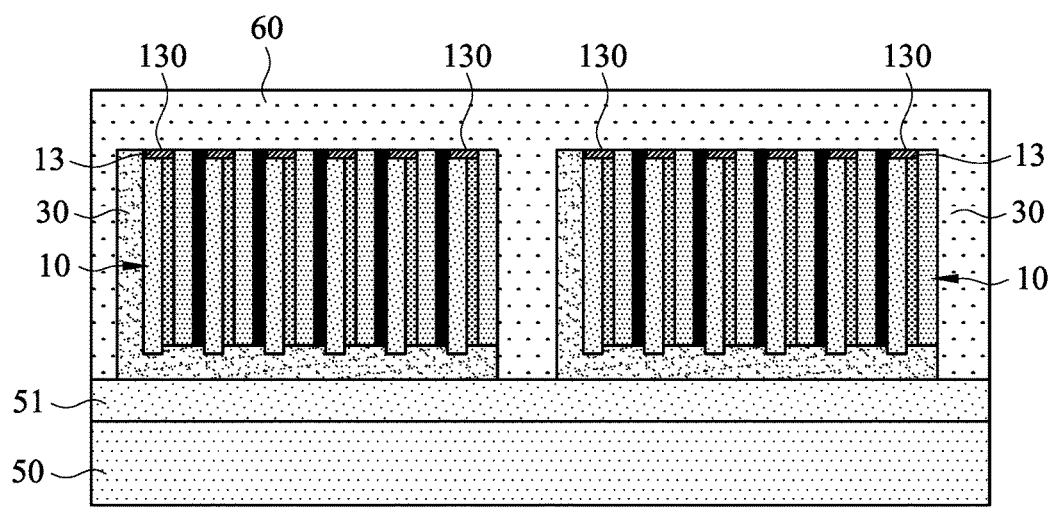

With reference to FIGS. 9A and 9B, the chip encapsulations 40 are encapsulated by a second encapsulant 60. The second encapsulant 40 may provide packaging protection to the chip encapsulations 40 to avoid electrical short and contamination.

Figure 10A:
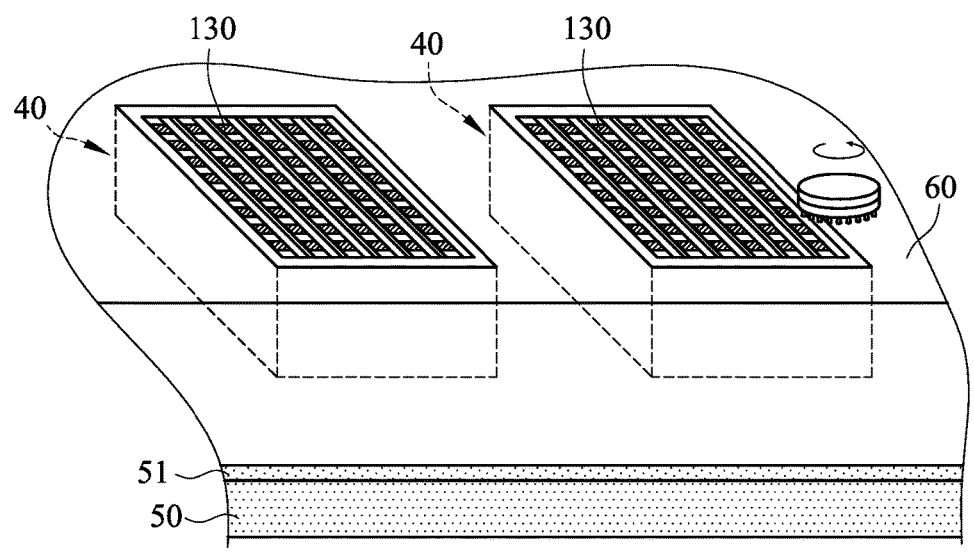
Figure 10B:
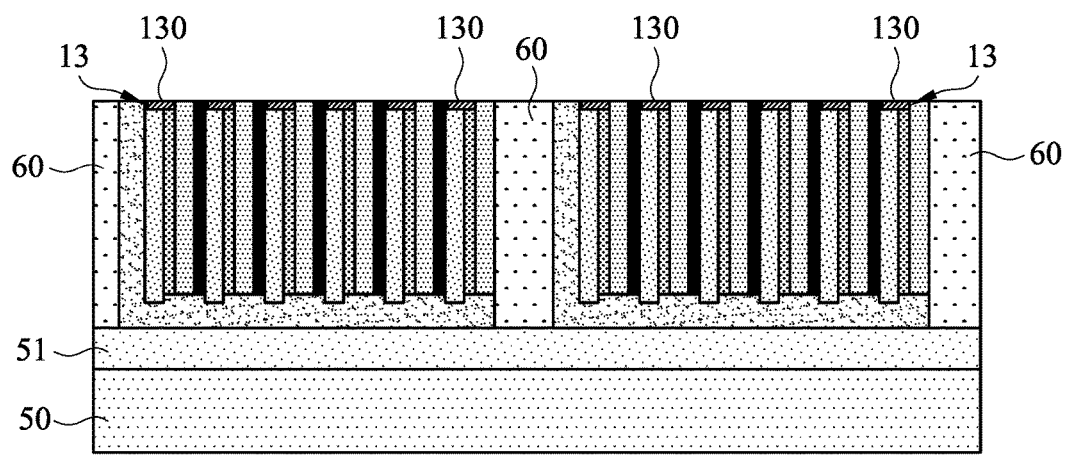

With reference to FIGS. 10A and 10B, the second encapsulant 60 is removed partially to reveal the cut edges 130 of the exterior conductive elements 13. In one embodiment, the second encapsulant 60 is removed through an etching, a polishing or a grinding process. The etching, polishing or grinding process is also used to ensure a planar surface when the cut edges 13 are revealed. In some embodiment, the cut edges 130 may not be exposed during the prior dicing process. The cut edges 130 may only be exposed through the first encapsulant 30 and the second encapsulant 60 after performing the process disclosed in FIGS. 10A and 10B.

Figure 11A:
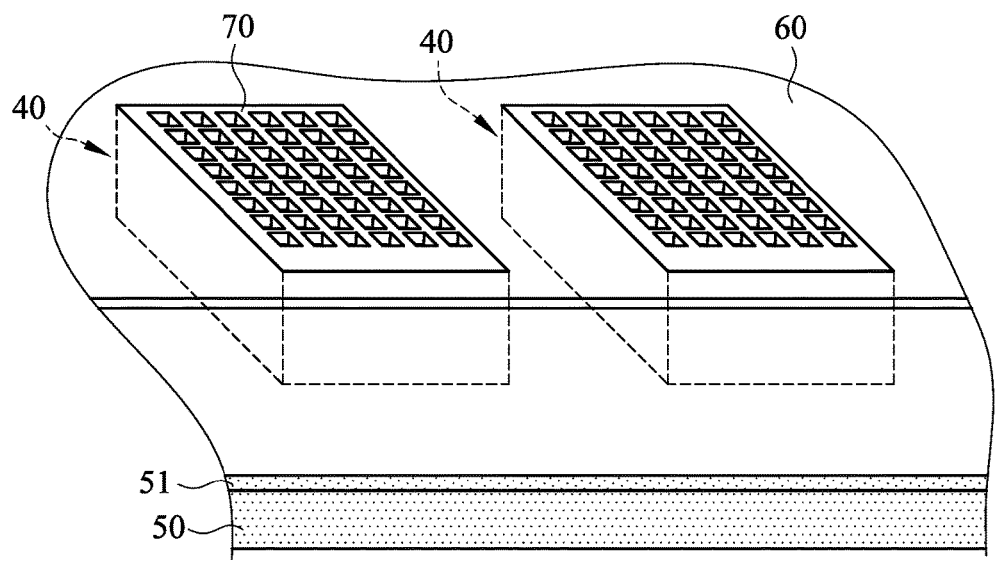
Figure 11B:
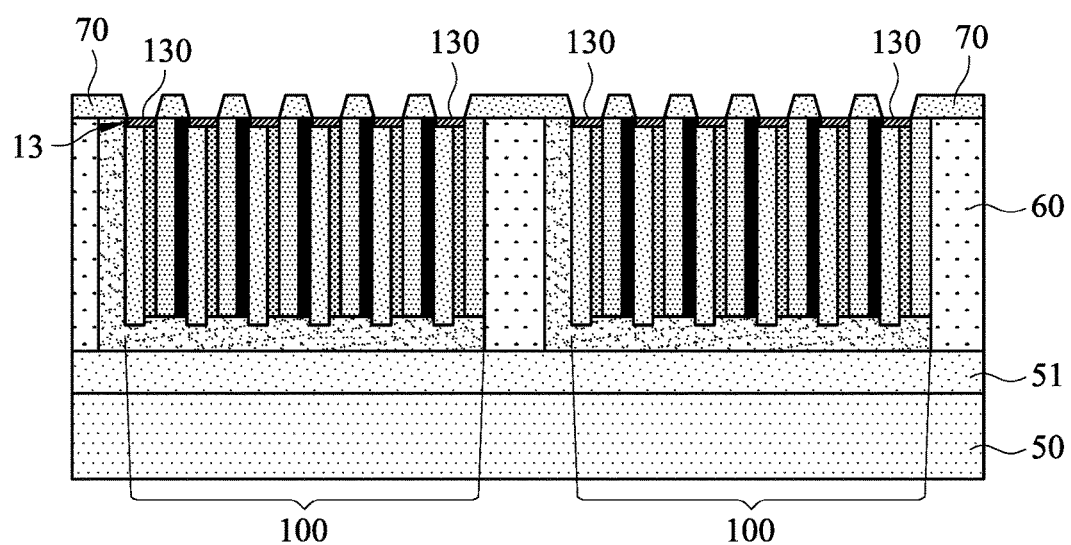

With reference to FIGS. 11A and 11B, a first dielectric layer 70 is formed on the lateral side of the chip packages 10 that have the exposed cut edges 130 and is etched to reveal the cut edges 130. In one embodiment, the first dielectric layer 70 is etched by a lithography process to reveal the cut edges 130. The first dielectric layer 70 may be a polyimide layer.

Figure 12A:
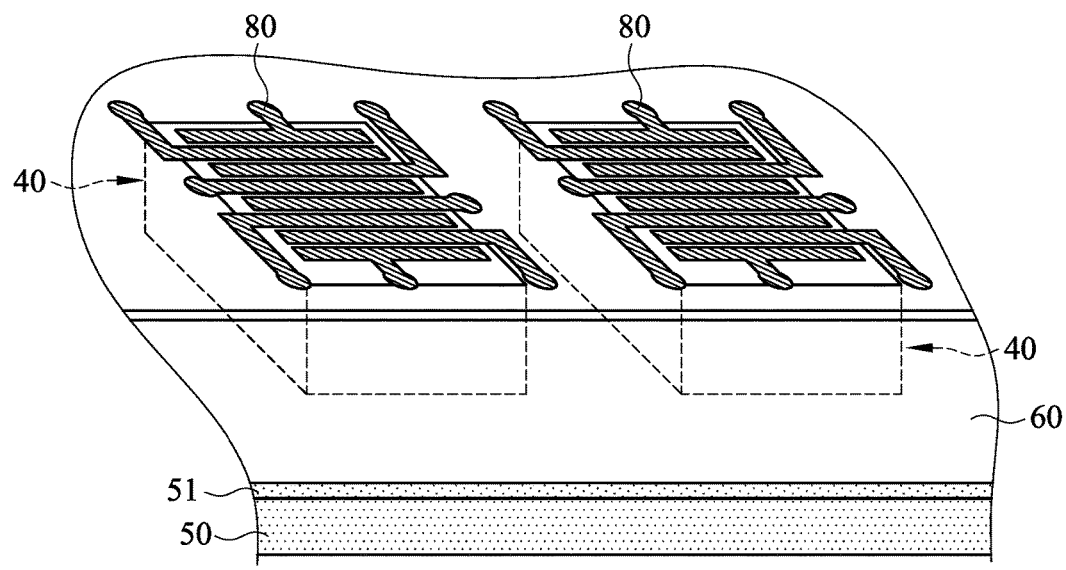
Figure 12B:
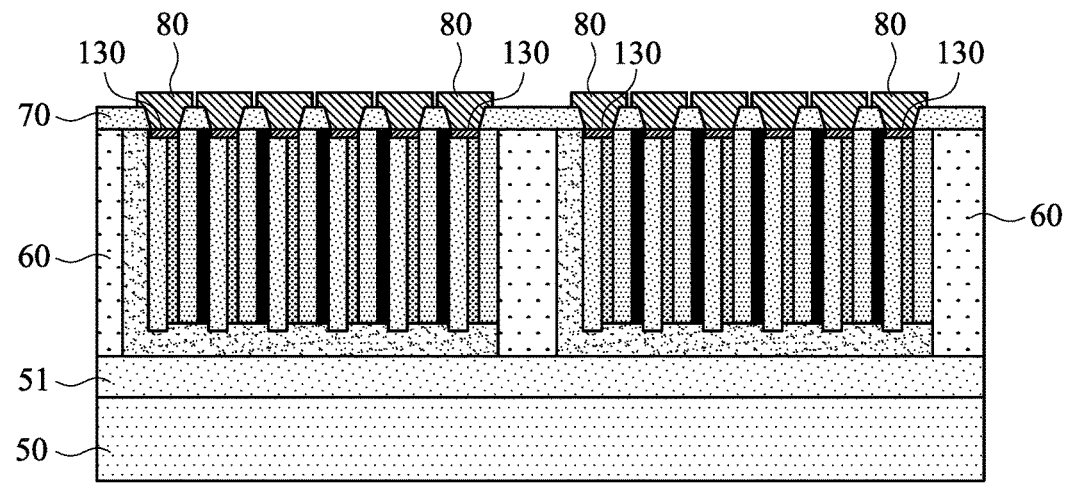

With reference to FIGS. 12A and 12B, a redistribution layer 80 is formed on the first dielectric layer 70 and is electrically connected to the cut edges 130. The redistribution layer 80 may be a circuitry formed by conductive metals. In one embodiment, the redistribution layer 80 may be a multi-layer metal stack such as Titanium (Ti)/Copper (Cu)/Copper (Cu) or Titanium (Ti)/Copper (Cu)/Copper (Cu)/Nickel (Ni)/gold (Au).

Figure 13A:
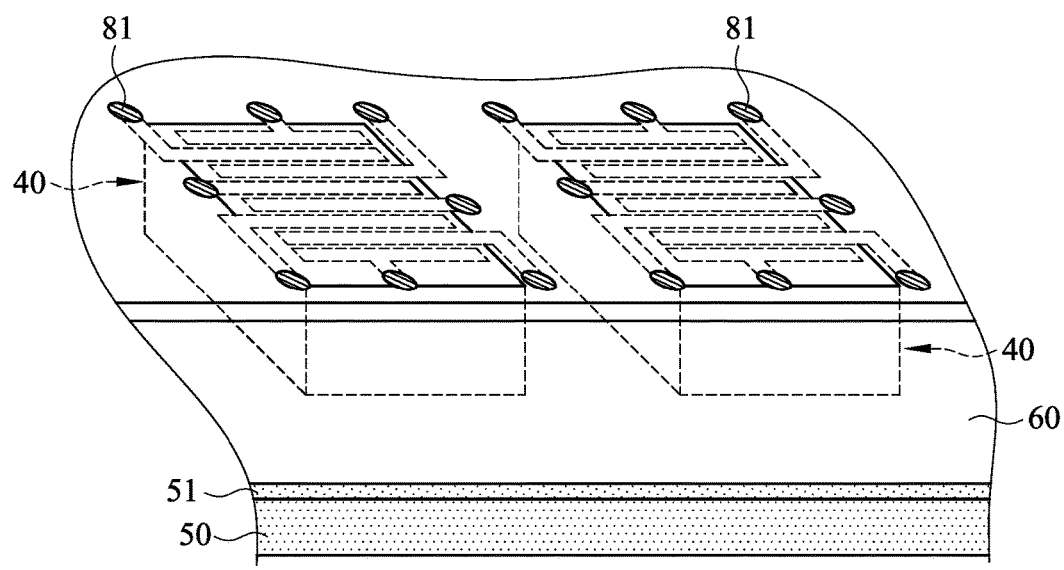
Figure 13B:
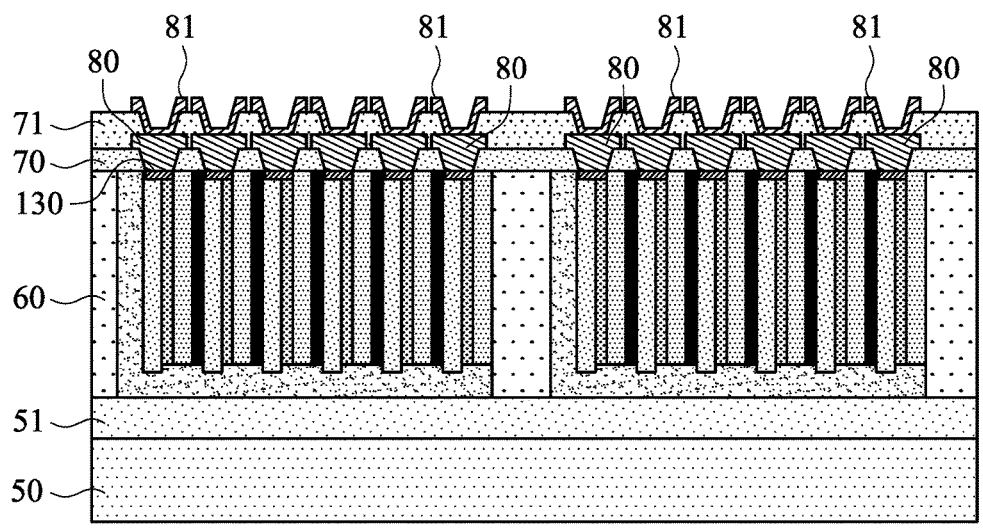

With reference to FIGS. 13A and 13B, a second dielectric layer 71 is formed on the redistribution layer 80. Then an under bump metallurgy (UBM) layer 81 is formed on the second dielectric layer 71 and is electrically connected to redistribution layer 80. In one embodiment, the second dielectric layer 71 is etched by a lithography process to reveal the redistribution layer 80. The second dielectric layer 71 may be a polyimide layer. In one embodiment, the UBM layer 81 is formed by sputtering. The number of the conductive layers such as redistribution layer 80 and the number of the dielectric layers 70, 71 are not limited to the embodiment as described and can be selectively designed.

Figure 14A:
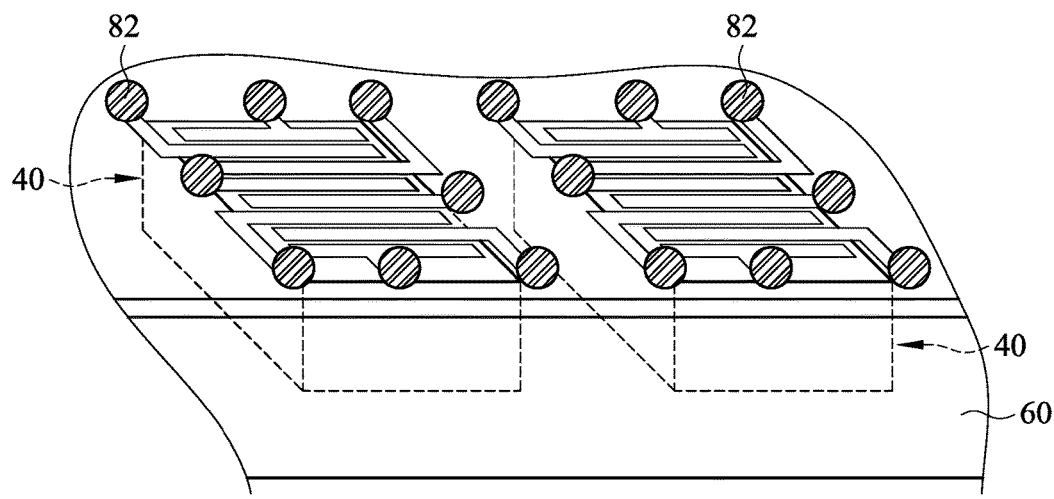
Figure 14B:
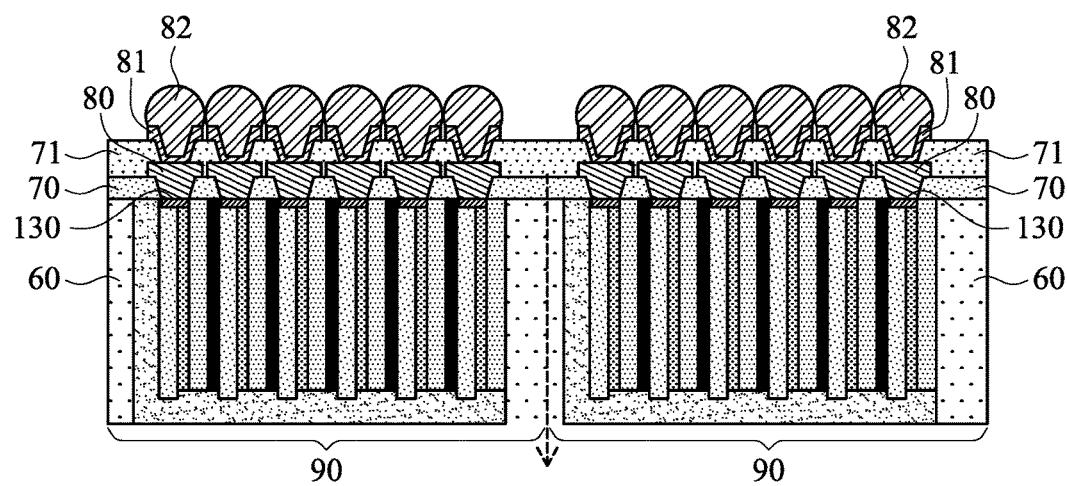

With reference to FIGS. 14A and 14B, a plurality of external terminals 82 are disposed on the second dielectric layer 71 and are electrically connected to the UBM layer 81. Then the carrier 50 and the adhesive film 51 are detached. The chip encapsulations 40 are singulated to form a plurality of stacked packages 90. The external terminals 82 may be a plurality of solder balls, solder pastes, contact pads, or contact pins.

With the cut edges 130 exposed on the at least one of the lateral side of the chip package 10, the electrical connections between the chips 11 and the electrical connection between the chips 10 and the external terminals 82 are achieved by the redistribution layer 80 formed on the cut edges 130 on the at least one of the lateral sides. Thus, the process for forming the electrical connections of the manufacturing method as described is simplified to enhance the reliability and the UPH for manufacturing the stacked package as described. Moreover, the requirement of the precision for stacking the chip packages 10 is relatively low since the chip packages 10 are aligned after dicing process as shown in FIG. 7 and the cut edges 130 are coplanar after the etching, polishing or grinding process as shown in FIGS. 10A and 10B. Therefore, the manufacturing method as described is further simplified to enhance the UPH for manufacturing the stacked package as described.

According to an embodiment of the present invention, the stacked package 90 may have, but not limited to, following structures, and the manufacturing method of the stacked package may have accordingly steps. In one embodiment as shown in FIG. 15A, the stacked package 90 includes the first dielectric layer 70, the redistribution layer 80, the second dielectric layer 71, the UBM layer 81 and the external terminals 82. The chips 11 may be able to electrically connect to an external printed circuit board through the electrical connections between the cut edges 130, the redistribution layer 80, the UBM layer 81 and the external terminals 82.

Figure 15B:
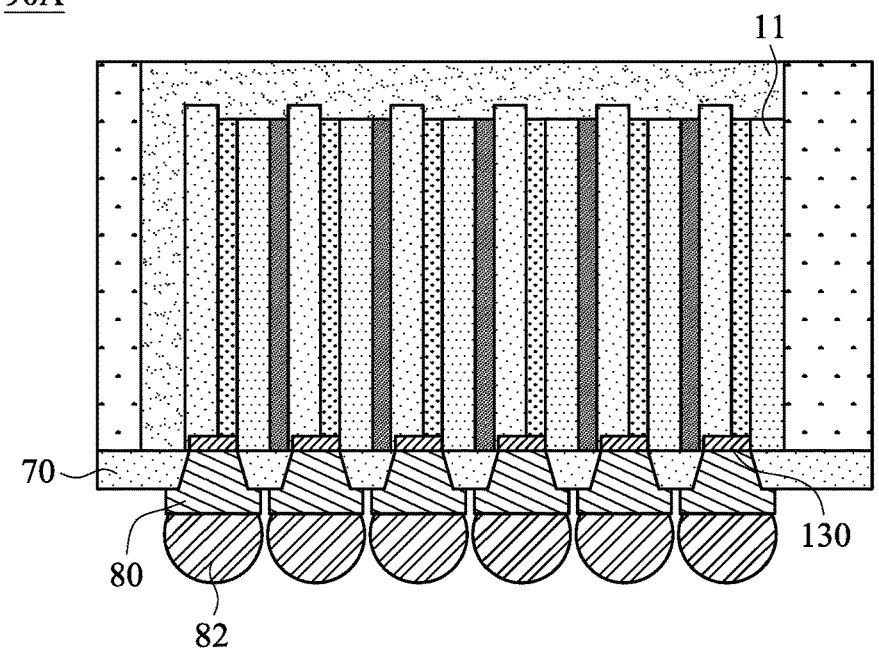
FIG. 15B is a front view in partial section of a second embodiment of a stacked package in accordance with the present invention.

In one embodiment as shown in FIG. 15B, the stacked package 90A comprises the first dielectric layer 70, the redistribution layer 80 and the external terminals 82. The chips 11 may electrically connect to an external printed circuit board through the connections between the cut edges 130, the redistribution layer 80 and the external terminals 82.

Figure 15C:
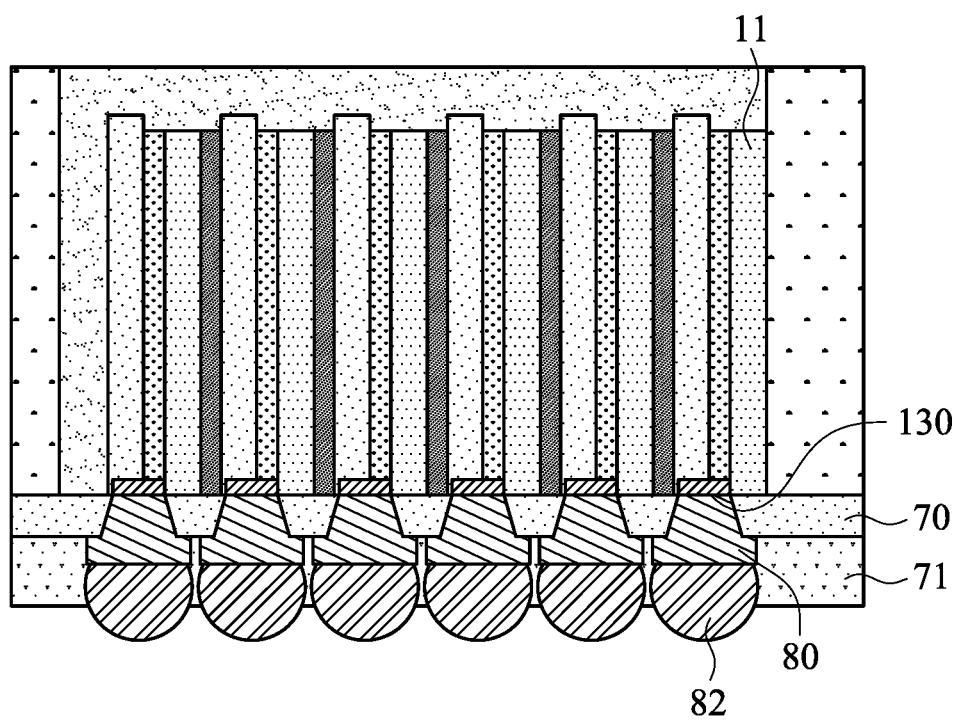
FIG. 15C is a front view in partial section of a third embodiment of a stacked package in accordance with the present invention.

In one embodiment as shown in FIG. 15C, the stacked package 90B comprises the first dielectric layer 70, the redistribution layer 80, the second dielectric layer 71 and the external terminals 82. The chips 11 may be able to electrically connect to an external printed circuit board through the electrical connections between the cut edges 130, the redistribution layer 80 and the external terminals 82.

Figure 16A:
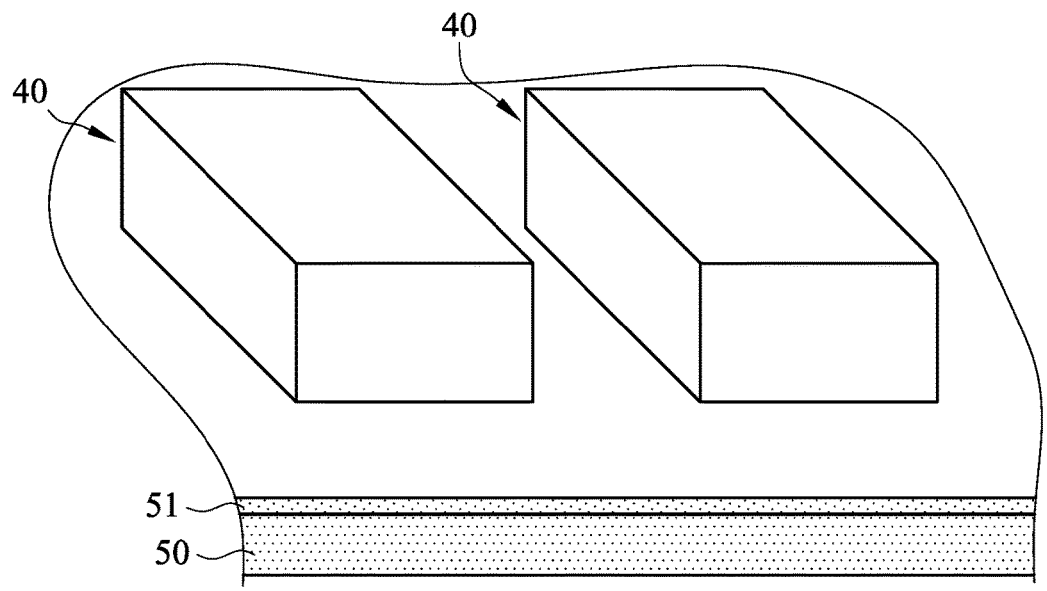
FIGS. 16A and 17A are perspective views of a structure of a stacked package during a second embodiment of a manufacturing process in accordance with the present invention.
Figure 16B:
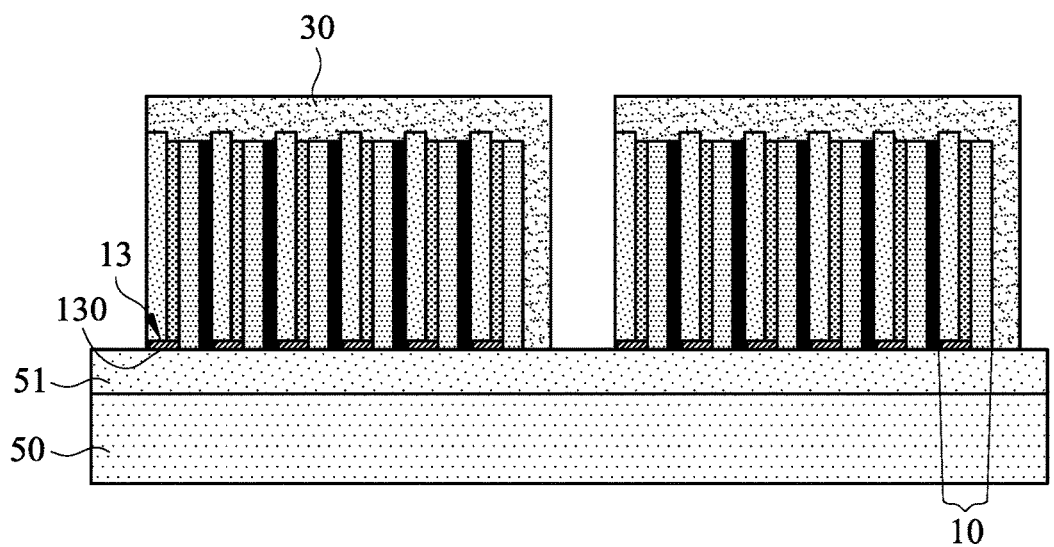
FIGS. 16B and 17B are front views in partial section of a stacked package during the second embodiment of the manufacturing process in accordance with the present invention.

Another embodiment of a manufacturing method of a stacked package in accordance with the present invention includes, but not limited to, following steps:

After the steps are performed as shown in FIGS. 5A to 7, the cut edges 130 of the exterior conductive elements 13 on one of the lateral sides of the chip packages 10 are disposed to face the carrier 50 when the chip encapsulations 40 are arranged on the carrier 50 as shown in FIGS. 16A and 16B.

Figure 17A:
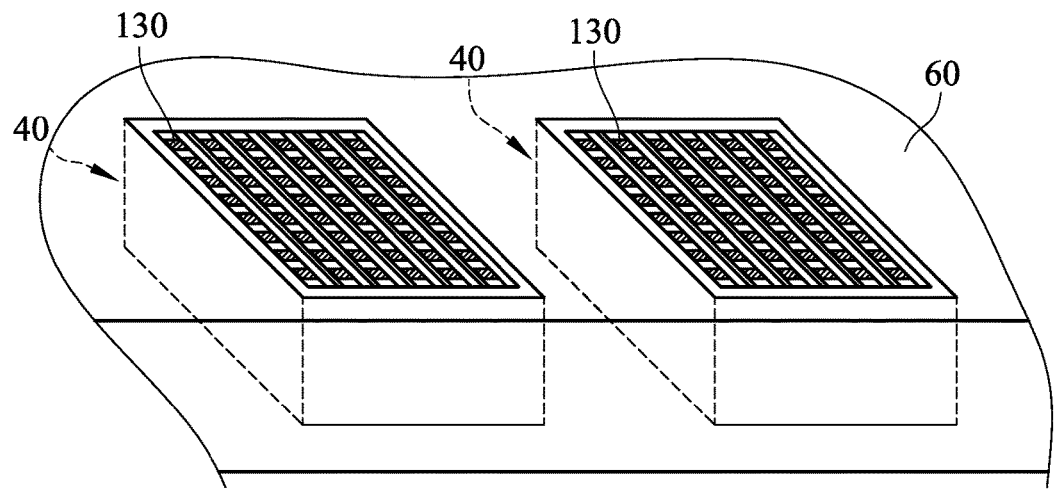
Figure 17B:
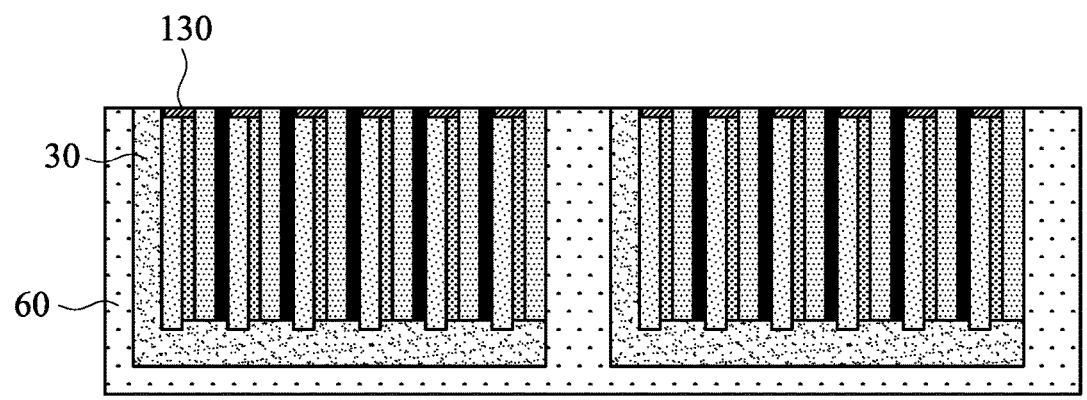

With further reference to FIGS. 17A and 17B, the carrier 50 and the adhesive film 51 are detached after forming the second encapsulant 60 to expose the cut edges 130 on one of the lateral sides of the chip packages 10. The steps to form the redistribution layer, the UBM layer and the solder balls are similar to the steps shown in FIGS. 11A to 14B.

Figure 18:
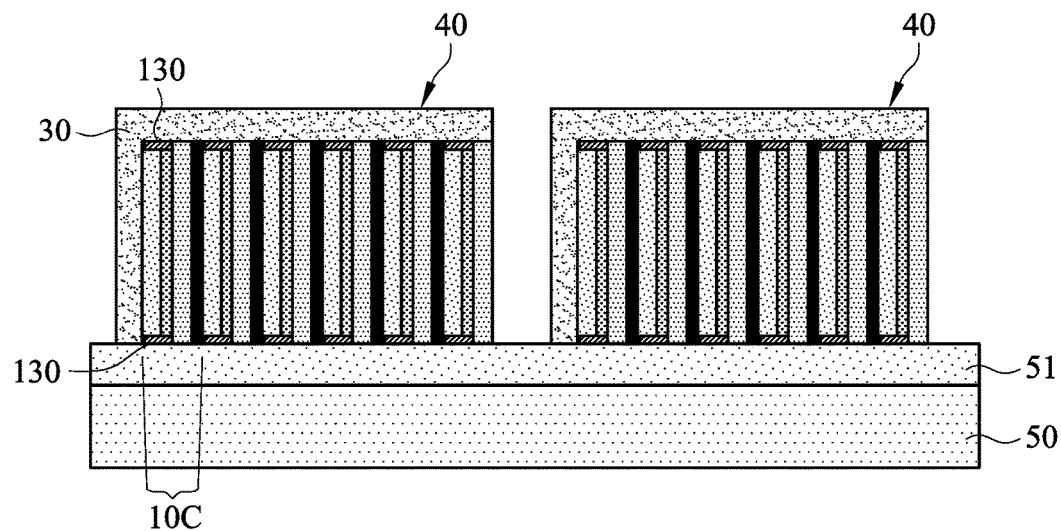
FIGS. 18 to 21 are front views in partial section of a stacked package during a third embodiment of the manufacturing process in accordance with the present invention.

Yet another embodiment of a manufacturing method of a stacked package in accordance with the present invention includes, but not limited to, following steps:

The chip packages 10C have cut edges 130C exposed on two lateral sides as shown in FIG. 4. After the steps are performed as shown in FIGS. 5A to 7, the cut edges 130 of the exterior conductive elements 13 on the first lateral side of the chip packages 10C are disposed to face the carrier 50 when the chip encapsulations 40 are arranged on the carrier 50 as shown in FIG. 18.

Figure 19:
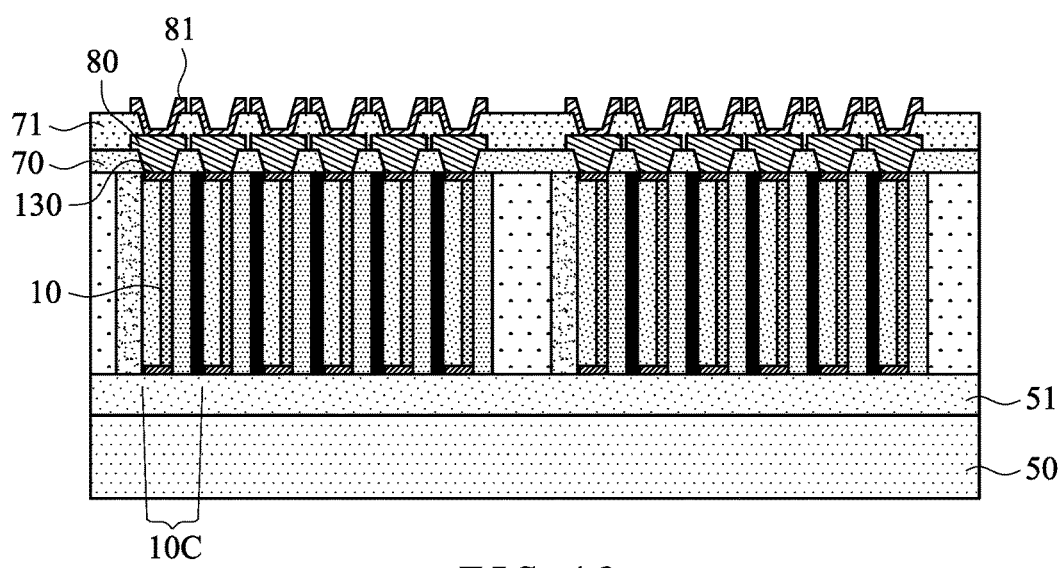

With reference to FIG. 19, the first dielectric layer 70, the redistribution layer 80, the second dielectric layer 71 and the UBM layer 81 are formed on the first lateral side.

Figure 20:
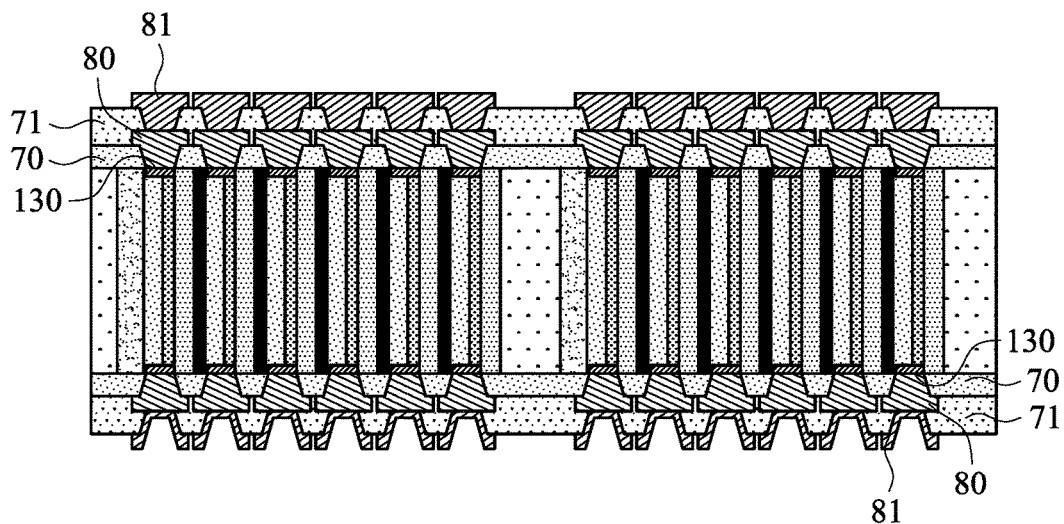

The electrical connection between the chips 10, the cut edges 130 on the second lateral side, the redistribution layer 80 and the UBM layer 81 is formed after the carrier 50 and the adhesive film 51 are detached. With further reference to FIG. 20, the first dielectric layer 70, the redistribution layer 80, the second dielectric layer 71 and the UBM layer 81 are formed on the second lateral side.

Figure 21:
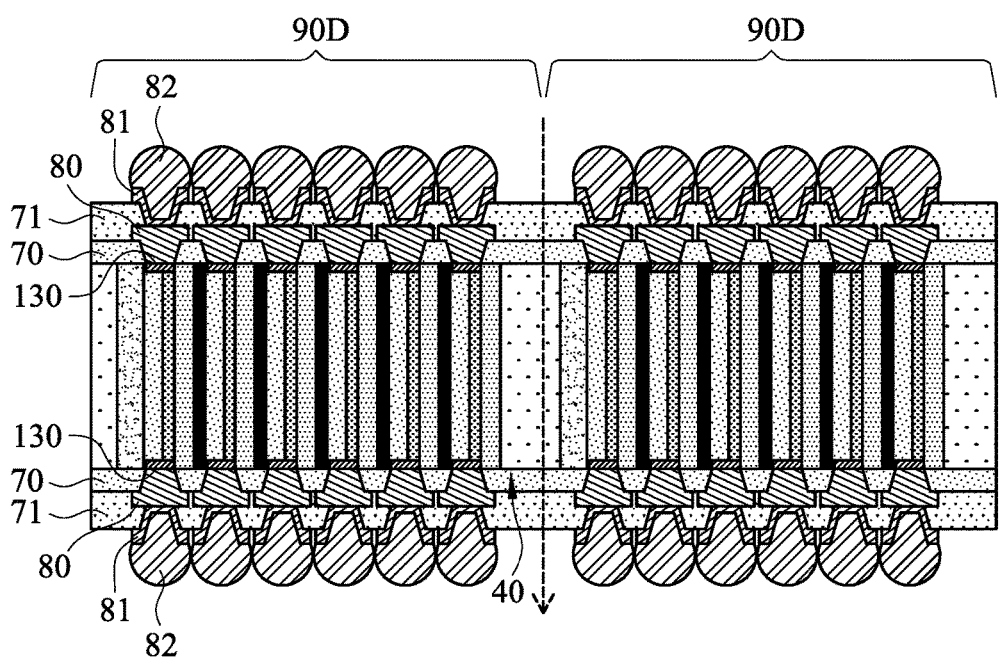

In some embodiment, with reference to FIG. 21, a plurality of external terminals 82 are disposed on the second dielectric layer 71 on the first and second lateral sides and are electrically connected to the UBM layer 81 on the first and second lateral sides. Then the chip encapsulations 40 are singulated to form a plurality of stacked packages 90D.

With the stacked package 90D has the external terminals 82 on dual sides, stacking with other semiconductor structures, passive components and so on are is more easily.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A stacked package comprising:
a plurality of chip packages vertically stacked aligned parallel to each other, and each chip package of the plurality of chip packages having
two lateral sides;
a chip having an active surface and a back surface opposite to the active surface, wherein the back surface of each of the chip packages faces the active surface of an adjacent chip package;
a passivation layer formed on the active surface of the chip; and
an exterior conductive element formed on the active surface of the chip and having a cut edge exposed on at least one of the two lateral sides, each of the two lateral sides comprising a lateral side of the chip, a lateral side of the passivation layer, and the cut edge;
an encapsulant encapsulating the plurality of chip packages and having an opening to expose the at least one of the two lateral sides;
at least one dielectric layer formed on the at least one of the two lateral sides and having patterned recess areas in the at least one dielectric layer to expose cut edges on the at least one of the two lateral sides; and
at least one redistribution layer formed on the at least one dielectric layer filled the patterned recess areas of the at least one dielectric layer and electrically connecting to the cut edges on the at least one of the two lateral sides.

2. The stacked package as claimed in claim 1, wherein
each chip package has two cut edges exposed respectively on both of the two lateral sides;
an amount of the at least one dielectric layer is two and the two dielectric layers are formed respectively on the cut edges on both of the two lateral sides; and
an amount of the at least one redistribution layer is two and the two redistribution layers are formed respectively on the two dielectric layers and connect respectively to the cut edges on both of the two lateral sides.

3. The stacked package as claimed in claim 2 further comprising
two additional dielectric layers formed respectively on the two redistribution layers and having a plurality of gaps to reveal the cut edges on the two lateral sides;
two under bump metallurgy layers formed respectively on the two additional dielectric layers and respectively connect to the two redistribution layers; and
a plurality of external terminals formed on and connecting to the two bump metallurgy layers.

4. The stacked package as claimed in claim 1, wherein
the exterior conductive element has
a bond pad formed on the active surface and encapsulated by the passivation layer; and
an exterior trace formed on the bond pad and extending out the passivation layer;
the cut edge of the exterior conductive element is disposed on an end of the exterior trace; and
the chip package further comprises a dielectric layer formed on the passivation layer and the exterior trace.

5. The stacked package as claimed in claim 1, wherein
the exterior conductive element has a conductive pad formed on the active surface and encapsulated by the passivation layer; and
the cut edge of the exterior conductive element is disposed on an end of the conductive pad.

6. The stacked package as claimed in claim 1, wherein
the exterior conductive element has
a bond pad formed on the active surface and encapsulated by the passivation layer; and
a through silicon via formed in the chip and connecting to the bond pad; and
the cut edge of the exterior conductive element is disposed on an end of the through silicon via.

7. The stacked package as claimed in claim 1, wherein the at least one dielectric layer comprises a first dielectric layer and a second dielectric layer, and the first dielectric layer is formed on the cut edges on the at least one of the two lateral sides, and the second dielectric layer is formed between the at least one redistribution layer and the external terminals.

8. The stacked package as claimed in claim 1 further comprising at least one under bump metallurgy layer, wherein
the at least one dielectric layer comprises a first dielectric layer and a second dielectric layer;
the first dielectric layer is formed on the cut edges on the at least one of the two lateral sides;
the at least one redistribution layer is formed on the first dielectric layer;
the second dielectric layer is formed on the at least one redistribution layer;
the at least one under bump metallurgy layer is formed on the second dielectric layer and connects to the at least one redistribution layer; and
external terminals are formed respectively on and connecting to the at least one under bump metallurgy layer.

9. The stacked package as claimed in claim 1, wherein the plurality of chip packages stacked on each other by using a plurality of adhesives attached respectively between adjacent chip packages.

* * * * *